United States Patent [19]
Fujimura et al.

[11] Patent Number: 6,034,424
[45] Date of Patent: *Mar. 7, 2000

[54] PACKAGE AND OPTOELECTRONIC DEVICE

[75] Inventors: Yasushi Fujimura; Yoshiki Kuhara, both of Osaka, Japan

[73] Assignee: Sumitomo Electric Industries, Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/902,580

[22] Filed: Jul. 29, 1997

[30] Foreign Application Priority Data

Jul. 31, 1996  [JP]  Japan .................................. 8-219218

[51] Int. Cl.[7] .......................... H01L 23/48; H01L 33/00; H01L 31/0203; H01L 23/043
[52] U.S. Cl. ............................ 257/696; 257/99; 257/433; 257/708
[58] Field of Search .............................. 257/99, 433, 692, 257/696, 102, 708

[56] References Cited

U.S. PATENT DOCUMENTS

| | | |
|---|---|---|
| 3,805,347 | 4/1974 | Collins et al. .......................... 257/99 |
| 4,047,075 | 9/1977 | Schoberl ................................ 257/433 |
| 5,179,461 | 1/1993 | Blauvelt ................................. 359/189 |
| 5,258,628 | 11/1993 | Tanaka et al. ......................... 257/79 |
| 5,656,847 | 8/1997 | Okazaki et al. ....................... 257/433 |
| 5,783,819 | 7/1998 | Shimoyama et al. ................. 250/239 |
| 5,798,536 | 8/1998 | Tsutsui .................................. 257/99 |

FOREIGN PATENT DOCUMENTS

| | | |
|---|---|---|
| 372 742 | 6/1990 | European Pat. Off. . |
| 4-111477 | 4/1992 | Japan . |

OTHER PUBLICATIONS

Optoelectronics—Devices and Technologies, vol. 9 No. 2 pp. 167–176, Jun. 1994 Surface Emitting Lasers, Kenichi IGA.

Primary Examiner—Teresa M. Arroyo
Attorney, Agent, or Firm—Pillsbury Madison & Sutro LLP

[57] ABSTRACT

A low-capacitance package having a wide hole, an L-shaped lead pin, other linear lead pins, an insulating material filling in the hole for fixing the L-shaped lead pin and another pin in the hole. Projecting from the hole, the horizontal part of the L-shaped pin is separated from the insulating material and stands higher than the surface of the package. A semiconductor device chip is fixed directly on the horizontal part of the L-shaped pin.

20 Claims, 9 Drawing Sheets load resistance circuit trans-impedance circuit
(Rf: load resistor)

transformer load circuit frequency performance of a prior PD equivalent circuit of a prior PD module $C_k$ : cathode·case capacitance
$C_a$ : anode·case capacitance
$C_s$ : submount·case capacitance L-shaped lead relation between wavelength ($\mu$m) and sensitivity (A/W) of PD frequency performance of prior PD and embodiment

PACKAGE AND OPTOELECTRONIC DEVICE

BACKGROUND OF THE INVENTION

1. Field of the Invention

This invention relates to a low-capacitance package suitable for optoelectronic devices for optical communication or optical measurement and to an optoelectronic device mounted on the package, for example, a photodiode (PD) module.

2. Description of Related Art

This application claims the priority of Japanese Patent Application NO. 8-219218 (219218/96) filed Jul. 31, 1996 which is incorporated herein by reference. The following explanation about various packages for photodiodes will provide a background for understanding the present invention.

[(1) Prior Art of Packages]

(Type 1 of prior packages) Metal-base package

FIG. 1(a) and FIG. 1(b) show a header of a known package called TO46 which has conventionally been used for photodiodes (PDs). FIG. 1(a) is a plan view, FIG. 1(b) is a sectional view of the header part of a TO46 package. An eyelet (1) of a disk shape has three lead pins (2), (3) and (4). The disc part is called an eyelet, because two pins of the disc seem to be eyes in the plan view. The leads are made from a FeNiCo alloy. One of the three is a case pin (2). The others are fixed in vertical holes dug in the eyelet (1) by a low-melting point glass (5). The glass insulates the lead pins from the eyelet (1). The disc eyelet (1) has a circular flange at the bottom and a base at the top. The flange has a diameter of 5.4 mm φ. The base diameter is 4.22 mm φ. The metal eyelet (1) has a thickness of 1.12 mm. A photodiode device is produced by die-bonding a photodiode chip directly on the central part of the eyelet (1), connecting electrodes of the chip to the lead pins (3) and (4), covering the eyelet (1) by a cap having a flat glass window or a lens, and sealing the inner space with an inert gas. The eyelet (1) is made from soft steel. This is a metal-base type example of prior packages.

(Type 2 of prior packages) Glass-base package

FIG. 2(a) and FIG. 2(b) show another known package called TO18. The package has a hat-shaped eyelet (6) made by bending a thin metal plate in a convex shape. The hollow of the eyelet (6) is filled with glass (7). The package having such an eyelet is called a glass-base type package. Three lead pins (8), (9) and (10) are furnished to the eyelet (6). One pin (8) is a case pin. Two pins are insulated by the glass (7) from the metal eyelet (6). The glass (7) supports the pins at the bottom of the metal eyelet (6). The metal plate has a thickness of 0.21 mm. The eyelet has a metal disc part of a 4.2 mm diameter and a bottom flange of a 5.4 mm diameter. The spacing between the neighboring pins is 2.54 mm in the eyelet (6). A photodiode device is built up by die-bonding a photodiode chip on the top of the eyelet (6), wirebonding electrodes of the chip to the lead pins, fitting a cap having a window or a lens, and sealing the inner space of the cap with an inert gas.

(Type 3 of prior packages) CD-laser package

A third type of package, known as the CD-laser package is inherently not a package for a photodiode but rather is a package for a laser diode. Laser diode packages are sometimes used as photodiode (PD) packages. Both a laser diode and a photodiode are optoelectronic devices. A laser diode actually produces light when electrically driven. A photodiode is a passive device for sensing light. Its characteristics change based on light incident thereon. FIG. 3 is a perspective view of a package of a compact disc (CD) laser diode. This is a 5.6 mm φ CD laser package. An eyelet (11) is a metal disc having a diameter of 5.6 mm. The 5.6 mm φ disc has three lead pins (12), (13) and (14). A laser diode chip (15) is vertically fixed on a side of a pole (16) of the eyelet (11). A photodiode chip (19) for monitoring the LD power is mounted on the central portion of the eyelet (11). A cap (17) having a window (18) is fitted on the flat surface of the eyelet (11). Since the diameter of the foot of the cap (17) is smaller than the diameter of the eyelet, the cap (17) can be positioned at an arbitrary spot on the eyelet. The cap (17) covers and protects the chips. The inner space is filled with an inert gas.

This type of package was originally intended to house a laser diode. It has advantages of a large thickness of the eyelet, high heat diffusivity, high freedom of positioning a cap on the eyelet, since the cap can be fixed at an arbitrary position on the flat eyelet by e.g., electric-resistance welding. The high heat conduction results from the thick eyelet. Coaxial alignment of the PD chip, the LD chip and the cap facilitates the design of optical system of the device. Conveniently, the optical axis adjustment is simplified to an axial direction and a radial direction. These advantages make the metal header suitable for use as an LD package.

The eyelet has the pole (16) for supporting the laser (15) vertically. The existence of the pole (16) is a characteristic as an LD package. If the pole (16) is removed from the eyelet (11), the eyelet (11) becomes flat. The flat eyelet can be diverted as an eyelet of a PD package. If the eyelet without the pole is used as an eyelet of a PD, the packages of PDs become similar to the packages of LDs. The use of common packages can treat both PDs and LDs by the same jigs in an assembly line and in an inspection line. CD (compact disc) lasers are widely used in many types of applications. Mass production of CD lasers has decreased the cost of packages of CD lasers. Low-cost is another advantage of the use of LD packages as PD packages.

FIG. 4 is a sectional view of a photodiode device mounted on a thick, metal eyelet diverted from a CD laser package. An eyelet (20) is provided with three lead pins (21), (22) and (23). One is a case pin (22) directly fixed to the eyelet (20) but the other pins (21) and (23) are insulated from the case (eyelet) (20). The pins (21) and (23) are fixed in holes (24) of the eyelet (20) by insulating, sealing glass (25). A submount (26) is fixed at the center of the eyelet (20). A photodiode (PD) chip (27) is mounted on the submount (26). A cap (28) is welded at the bottom to the eyelet (20). The cap (28) has a top opening and a lens (29) on the opening. Light beams emitted from an end of an optical fiber are converged to the PD chip (27) by the lens (29). The cap (28) seals the inner space of the package with an inert gas. Since the PD (2) must be insulated from the case (eyelet) (20), the PD chip (27) is mounted via an insulator, i.e., the submount (26) upon the package.

[(2) Prior PD modules]

(Prior art 4: photodiode module)

A conventional photodiode module will now be explained. FIG. 5 shows a photodiode module having a package and a PD chip furnished in the package. The package is the same as the package shown by FIG. 4 which has been explained as a PD package diverted from prevailing packages for LDs of FIG. 3. The photodiode chip (27) is soldered on the submount (26) fixed on the eyelet (20). The cap (28) is fixed on the package (20) and the inner room is filled with an inactive gas.

A cylindrical sleeve (30) is fitted around the outside of the eyelet (20). A cylindrical ferrule holder (31) with an axial opening is welded at an optimum position on the sleeve (30). A ferrule (33) with a narrow vertical hole is inserted in the opening of the ferrule holder (31). An end of a single-mode fiber (34) has been inserted into the vertical hole of the ferrule (33). The front end of the ferrule (33) has been polished in order to prevent the reflected light from returning to the LD. An elastic, conical bend-limiter (35) is capped on the tail of the holder (31) for prohibiting the optical fiber (34) from bending in an excessive small radius of curvature. An anode (annular p-electrode) of the PD chip (27) is wirebonded to the anode pin (23). A cathode (bottom n-electrode) of the PD (27) is soldered on the metallized film on the submount (26). The cathode is connected to the cathode pin (21) by wirebonding the metallized film to the pin (21). In this example, the cathode must be insulated from the case (20) by the submount (26). The following amplification circuit requests the insulation of the cathode from the case (20). Prior packages and prior modules have been clarified. A photodiode is a device of converting light power to a photocurrent. A photodiode requires an electric circuit for biasing the pn-junction, converting the photocurrent to a voltage and amplifying the photocurrent. Then typical electric circuits for operating photodiodes are explained now.

[(3) Prior art of the electric circuits for driving photodiodes]

(Prior art 5: Resistance Load Circuit)

FIG. 6 shows a well-known photodiode circuit having a resistance load. The load resistance $R_L$ is joined to the anode of a photodiode (PD). The cathode of the PD is connected to the power source voltage Vb. The other end of the $R_L$ is grounded. Thus the pn-junction of the PD is reversely biased by Vb. The case pin is grounded. The cathode should be insulated from the case. In many cases, the load resistance is 50 Ω. The photocurrent $I_p$ is converted to a voltage by the resistor $R_L$. An amplification device amplifies $R_L I_P$ by a certain ratio to an output voltage. This circuit excels in the speed of response, because the load resistance is low enough. This type circuit can operate on signals up to several gigahertzs (GHz). However, this circuit has the drawbacks of low sensitivity due to the low load resistance and low signal/noise (S/N) ratio due to poor sensitivity. This circuit is suitable only for strong input signals. Weaker input signals require circuits that have a higher input impedance.

(Prior Art 6: Trans-impedance Circuit)

FIG. 7 shows a trans-impedance circuit for a PD. The anode of the PD is connected to the input of an amplifier (AMP). The output of the AMP is fed back to the input by a resistor Rf. In this case, Rf essentially constitutes the input impedance. The input impedance can be made sufficiently large by increasing the value of resistance Rf. A high input impedance can strengthen the signals and enhance the S/N ratio. This circuit is suitably used for the detection of digital signals (binary signals). In the case of digital signals, even if the input signal contains a signal distortion, the binary signals can be reformed by inserting a wave-trimming circuit. This circuit is effective when the signals do not require a high speed processing and the signals are faint enough.

(Prior Art 7: Transformer Load Circuit)

FIG. 8 shows a transformer load circuit. The anode of a photodiode (PD) is connected to one end of a primary coil of a transformer. The other end of the primary coil is connected to an end of a second coil. The other end of the second coil is grounded. Both coils are air gap coils. The primary coil is coupled with the secondary coil by a magnetic field. The turn ratio of the coils is N:1 where N is larger than 1 (N>1). The input impedance can be enhanced by raising the turn ratio. The ratio of impedance is in proportion to $N^2$:1. For example, if the turn ratio is 2:1 and the impedance of the AMP is 75 Ω, the input impedance on the PD is 300 Ω. The current ratio is raised to 1:N. Thus the current on the amplifier (AMP) is N times as big as the photocurrent of the PD. Thus the load transformer effectively raises the input impedance and amplifying the current.

Further, the AMP amplifies the voltage of the intermediate terminal of the transformer. The circuits of FIG. 6 and FIG. 7 cannot regenerate analog signals with high fidelity since the resistance $R_L$ and the AMP induce noise. In contrast, this circuit has an advantage of low noise since the PD photocurrent is directly amplified by the transformer. The transformer-load circuit is suitable for analog signals. Fiber-Optic-CATV systems which send analog signals by light, in general, employ such transformer load circuits. However, this circuit suffers from a drawback of narrowing the frequency range because of the current-amplification by a transformer.

The weak point of the transformer load circuit is the reduction of the frequency range width due to the coil coupling. The reason why the transformer coupling reduces the frequency range is explained by referring to FIG. 9. FIG. 9 exhibits the relation between the amplifier output (dB) and the frequency (MHz) when the turn ratio is 2:1, the impedance of the AMP is 75 Ω and the input impedance is 300 Ω. The abscissa is the frequency (MHz) of the input signals. The ordinate is the logarithmic power of the AMP. The signal power at 50 MHz is deemed to be a standard, and is set to be 0 dB. The output power must exist within the scope of ±1 dB from the standard. In this case, the curve crosses the horizontal line of −0.1 dB down at 600 MHz. Thus the circuit can amplify the signals up to 600 MHz. The upper limit is 600MHz. The frequency range width is 600 MHz in the example. The transformer coupling decreases the frequency range width. 600 MHz was sufficient for prior CATV systems, but future CATV systems will require a wider frequency range.

Initially, optical CATV systems required only a few channels for transmission of signals. However, the channel requirement has increased. Present CATV systems require 40 channels as a standard. 40 channels require a wide frequency range of about 400 MHz to 450 MHz. Recent developments will cause CATV systems to require 80 channels to 110 channels. Such an increase in the number of channels will require a further widening of the frequency range to 860 MHz instead of 450 MHz. Namely, the frequency range must be doubled for future pervasion of the Fiber-Optic-CATV. Conventional PD modules such as shown in FIG. 9 have only a 600 MHz frequency range, if the restriction of ±1 dB is imposed to the performance of PD modules. Future development of the Fiber-Optic-CATV needs photodiode modules having a still wider frequency range. The expansion of frequency range of PD modules is not all of the requirements in the future Fiber-Optic-CATV system. There are problems for PDs other than the frequency range.

Low price is one of the most important requirements for further prevalence of the Fiber-Optic-CATV. It is desirable to make a new transformer-load type PD module having a wider frequency range without enhancing cost and impairing gain. PD modules must have a frequency range of at least 860 MHz for receiving signals of about 100 channels.

What restricts the frequency range of PDs? The properties of the photodiode themselves, of course, have an influence on the frequency range of the PD module. A more serious factor that restricts the frequency range of PD modules is the electrostatic capacitance C between a PD chip and a package. The frequency range of PDs is restricted by the time constant τ (=CR) which is a product of the chip•package capacitance C and the resistance R of a load resistor.

The frequency range can be expanded by lowering the load resistance R or decreasing the capacitance C between a chip and a package.

This invention aims at expanding the frequency range by reducing the electrostatic capacitance C. The mounting of a PD chip upon a packages has been explained hitherto. The capacitance varies according to the size of a chip, the size of a package, the diameter of the pin hole and the length and diameter of the pins. The other aim is related to a new way of mounting the chip on the package. The minimum electrostatic capacitance is determined by the mounting structure of a chip on a package. The capacitances between each pin and a case are explained by citing several kinds of packages hereafter.

(1) TO46 package (FIG. 1)

An example of FIG. 1 has a flange of 5.4 mm φ, a base of a 4.22 mm φ and a thickness of 1.12 mm. The circle on which the pins exist has a diameter of 2.54 mm. The eyelet is made from mild steel. The case (eyelet) has three pins, i.e. a case pin, an anode pin and a cathode pin. Since the anode pin and the cathode pin are insulated from the case, some capacitances occur between each pin and the case. The capacitances are measured in the package.

Case•anode capacitance=0.62 pF ~0.67 pF

Case•cathode capacitance=0.8 pF

Here, the case•cathode capacitance is measured on condition that the chip is bonded on a submount of 1.0 mm square ×0.25 mm being fitted on the case. Thus the submount contributes to the cathode•case capacitance. Thus the sum of the capacitances is about 1.45 pF.

(2) TO18 package (FIG. 2)

The FIG. 2 arrangement has a flange of 5.4 mm φ and a base of 4.2 mm φ. The circle on which the pins align has a diameter of 2.54 mm φ.

Case•anode capacitance=0.42 pF~0.47 pF

Case•cathode capacitance=0.42 pF~0.47 pF

Submount capacitance=0.27 pF

The total of capacitances is approximately 1.3 pF.

It is inevitable that the frequency range is suppressed by the package capacitance as long as a PD module uses such a large capacitance package. Although it is well known that the package capacitance restricts the frequency range of a PD, people believe that current packages have already have the minimum capacitance that can be achieved and that there is no room for reducing the package capacitance any more. The Inventors, however, have noticed the possibility of reducing package capacitance further by providing a new package structure.

OBJECTS AND SUMMARY OF THE INVENTION

It is one purpose of the present invention to provide a package with a smaller capacitance than prior packages.

Another purpose of the present invention is to provide a photodiode endowed with a smaller electrostatic capacitance which is suitable for optical communication systems of a wider frequency range.

A further purpose of the present invention is to provide a photodiode with high speed response without raising the cost.

A still further purpose of the present invention is to provide an optical device having a smaller capacitance than prior ones.

This invention aims at reducing the electrostatic capacitance of optical devices (PDs, LDs or LEDs) by providing a new structure arrangement for a package. Although the concept of optical devices includes photodiodes, laser diodes and light emitting diodes, the invention will be explained only with reference to a photodiode as an example. It is to be understood, however, that the invention is not so limited. The electrostatic capacitance of a photodiode itself originates from the pn-junction. The capacitance of the pn-junction is determined by the area of a light receiving region and the voltage applied to the pn-junction. It is difficult to reduce the capacitance of the chip itself. An alternative is to decrease the capacitance between a package and a chip. The Inventors have found an effective arrangement for lowering the case•chip capacitance by considering what factors determine the capacitance between a chip and a package. The Inventors utilized the above mentioned CD-laser package as a photodiode package, and tried to reduce the capacitance of the PD package. The electrostatic capacitance of a PD device originates from the capacitance between each pin and a package and the capacitance between a PD chip and a package. If a submount is inserted between the chip and the package, new capacitances are borne between the chip and the submount and between the submount and the case.

FIG. 10 shows an equivalent circuit of the PD module having a submount, for example, as exhibited by FIG. 4. Although the circuit includes inductances, FIG. 10 ignores the inductances, because the inductances are insignificant for an improvement of the present invention. FIG. 10 shows three capacitances; cathode•case capacitance Ck, submount capacitance Cs and anode•case capacitance Ca. In a prior package, Ck=0.65 pF(650fF), Ca=0.65 pF(650 fF) and Cs=0.27 pF(270 fF). The sum is about 1600 fF in the package. The junction capacitance of the PD chip itself is 340 fF at the reverse bias of 15V.

The electrostatic capacitance of a capacitor can roughly be estimated by a formula of C=εS/d for parallel flat electrodes, where ε is the dielectric constant of the medium, S is the area of electrodes and d is the distance between electrodes. The capacitance between a pin and a case results from the close disposition of the pin to the hole wall of the case. The formula for the capacitance of a pin enclosed by a cylindrical hole is different from that of parallel flat electrodes. This simple formula teaches us practically about the capacitance between the pin and the hole.

It is effective for the reduction of the capacitance of optoelectronic devices to decrease the dielectric constant of the insulator or to increase the distance between two electrodes. Those skilled in the packaging arts know this. But many believe that present packages have already attained to the minimum level of capacitance that is possible. The Inventors have considered the problem of reducing package capacitance further.

The Inventors, however, noted the possibility of reducing the capacitance borne by the submount by reviewing FIG. 8 (equivalent circuit), FIG. 11(PD package) and FIG. 4 (PD package). The submount-induced capacitance depends not upon the area of the submount itself but upon the area of the PD chip. The area S cannot be decreased in the formula C=εS/d of the submount capacitance, because S has been determined by the PD chip. A thick submount would abate the capacitance, but would raise the cost of the package, because the submount is made from expensive ceramics.

Another possibility would be to omit the submount. The removal of submount would decrease the submount•case capacitance Cs. This is, however, impossible, as it is. If the cathode (n-electrode) were to be directly fixed on the case, the cathode could not be insulated from the case and the amplification circuits shown in FIG. 6, FIG. 7 and FIG. 8 could not be built any more. The cathode (n-electrode) must be insulated from the case. Since the bottom surface is the cathode of the PD, the cathode must be fixed on some part of the package.

If the cathode were to be fitted on the case, the cathode would directly be connected to the case, which contradicts the current PD circuits shown in FIG. 6, FIG. 7 and FIG. 8. How can the cathode be fixed on the package? In the current structure, the cathode must be connected to the cathode pin by a wire. Then the direct mounting of the cathode on the lead pin could overcome the difficulty of insulating the cathode from the case.

In any case, the cathode must be wirebonded with the lead pin. Then it would be more convenient to bond the chip directly on the cathode lead pin without being mounted on a submount. If the chip were bonded on the lead pin, the capacitance would decrease by the submount capacitance Cs.

However, pins stand vertical to the surface of the eyelet in the current package, because the pins are merely straight sticks. If a PD chip were mounted on a side surface of the pin, the PD chip would face in the side direction. The light goes into the package in the axial direction. In this case, the light would be in parallel to the surface of the PD chip, and the PD chip could not detect the light at all.

As Inventors had the incite to bend the tip of the pin at a right angle, making a horizontal portion, and mounting the chip on the tip of the pin in the horizontal plane. The chip faces upward vertical to the light axis. The chip will be able to detect light entering the PD package in vertical direction.

Pins are arranged on a circle of a radius (r) defined on the eyelet in both three-pin and four-pin packages. In the case of the three-pin type, the pins are disposed on the circle with an angle of 90 degrees. When the package is held upside down, the cathode pin (r, 0°), the case pin (r, 90°) and the anode pin (r, 180°) are arranged clockwise.

Our package is made by bending the tip of the cathode pin toward the center by 90 degrees at a certain height from the eyelet surface, and bonding a PD chip at a point where the axial line crosses the tip on the bent tip of the cathode pin. The light beams enter the PD chip, because the PD lies on the beam line, as being orthogonal to the beam line. The PD chip, separating from the metal surface of the eyelet, floats in the air in the package. Since the cathode is directly bonded to the cathode pin, there is no need for a wire and the step of wirebonding between the pin and the submount. Of course, the anode pin is joined to the other pin by a wire.

The bent portion of the lead pin should be rigorously orthogonal to the beam line; namely θ=90 degrees, which is the bending angle of the pin. Further, the tip is widened, because the pin is too narrow to lay a chip on the tip. $P_0$ is the width of the pin, P is the width of the widened tip of the pin. These widths should satisfy the inequalities $P_0<W$ and $P \geq W$, where W is the width of the chip. Namely, θ=90 degrees and $P \geq -W$ are required to the cathode pin in the present invention.

In the package, the capacitance is decreased by the submount capacitance Cs, because the submount is omitted. The big decrease of capacitance with respect to known packages allows for a higher speed response device. The enhanced performance possible with our package is quite significant.

The cathode pin is extended for taking a margin of bending and a space for mounting a chip. An increase of capacitance may be borne between the case (eyelet) and the bent portion of the pin by the transformation. Further structural changes are required for decreasing the extra capacitance. First, the eyelet itself should be transformed into an eyelet having a wide cavity beneath the bent portion of the cathode pin as to eliminate the case metal from the space below the PD chip. Since no metal portion (case) exists under the horizontally bent port of the pin, the capacitance between the bent portion and the case (eyelet) is abated. The space beneath the bent part of the pin should be filled with an insulator, e.g. glass for suppressing the increase of the capacitance between the eyelet and the pin. The height of the bent portion should be made higher enough than the surface of the eyelet. The vertical distance between the eyelet and the bent part alleviates the capacitance between the cathode pin and the case.

Attention should be paid also to reducing capacitance between the anode pin and the case. The pin holes should be enlarged for the purpose of decreasing the pin-case capacitance. Our arrangement decreases the pin-case capacitances by digging a wide integrated hole through which pins pierce in the vertical direction, and fixing the pins with glass in the wide common hole. The wide integrated hole further decreases the cylindrical capacitances between each pin and the hole wall of the case, since the average distances between each pin and the hole wall become more distant than prior packages which allocate individual narrow holes to cathode pins and anode pins for piercing therethrough.

Our invention has the following features:

① a tip of a pin is bent in a horizontal direction and a photodiode chip is fixed directly on the bent portion of the pin, ② the bent portion of the pin is higher than the upper surface of the eyelet, ③ a wide integrated hole increases the distances between each pin and the hole wall.

FIG. 11 shows the structure of a known photodiode. FIG. 11 corresponds to FIG. 4, previewing explained. The case (eyelet) (20) is a thick disc made from iron alloy. The cathode pin (21), the anode pin (23) and the case pin (22) project downward from the bottom. In the prior PD, the cathode pin (21) and the anode pin (23) are inserted into narrow individual holes and are fixed in the holes by filling the holes with glass (25) in order to insulate the pins from the case. Here, the insulating parts have a capacitance of $\epsilon d/\log(b/a)$ (=Ck=Ca) between the pins and the holes. Here, "a" denotes the diameter of each pin, "b" designates the diameter of each hole, "d" is the length of each hole, "ε" and is the dielectric constant of the filled glass. Since the denominator log(b/a) is small, the pin capacitance is not small.

Further, the prior PD device has the submount (26) at the center of the surface of the case (20). The chip (27) is mounted on the submount (26). Since the bottom of the PD chip is a cathode in many cases, the submount induces an extra cathode•case capacitance (submount capacitance) of $Cs = \epsilon S/t$, where S is the area of the bottom of the chip, t is the thickness of the submount, and ε is the dielectric constant of the submount. The capacitances of the PD device are Cs+Ck=0.92 pF for cathode•case and Ca=0.65 pF for anode•case. The total capacitance is 1.6 pF, which is still too large.

FIG. 12 shows the structure of the PD of the present invention. A case (40) is a thick disc of iron, like that of the eyelet of a laser diodes for a compact disc player, as mentioned before. It is possible to adapt other types of packages for use with PD devices according to the present invention. A wide elongate hole (39) for pins is formed at the center of the iron eyelet (40), which corresponds to the feature ③ described before. A case pin (43) is directly stuck to a spot of the bottom of the case (eyelet) outside of hole (39).

An anode pin (44) and a cathode pin (42) pierce the elongate hole (39) together. Two pins (44) and (42) are not separated by a metallic part of the eyelet (40). The pins (44) and (42) are fixed by an insulating material (41), i.e. glass in the elongate hole (39).

The cathode pin (42) is an L-shaped member having a long foot, a bending corner (45) and a widened horizontal part (46). The horizontal part (46) is parallel with the surface of the eyelet (40). The bending angle θ is 90 degrees for the corner (45). The wide horizontal part (46) is directly equipped with a photodiode chip (47) without a submount. The chip (47) should be positioned by adjusting the center of the chip on the vertical central line of the case (40) in order to converge light beams through a lens to the center of the PD chip (47). A p-side electrode of the chip (47) is connected by a wire (48) to the anode pin (44).

This structure enables the photodiode device to reduce the capacitances based on some factors. The direct mounting of the chip on the pin entirely eliminates the submount capacitance Cs (Cs=0). Besides, the pin•case capacitances are also reduced, since the ratio b/a is substantially heightened in the capacitances ε d/log(b/a) of Ck or Ca due to the wideness of the pin hole (39). The distance between the horizontal part (46) and the glass (41) alleviates the capacitance between the horizontal part (46) and the case.

However, the L-shaped pin is not novel itself. Such an L-shaped pin has been adopted for some prior packages. FIG. 13 and FIG. 14 show known TO18 type package made by Shinkodenki Kogyo corporation. The package is one of the variations of the TO18 type package shown in FIG. 2. In FIG. 13, the inner space of a cylindrical cap (59) is filled with glass (69) (FIG. 14) for insulating and fixing pins to the cap (59). An L-shaped cathode pin (52) having a bending point (55) is fixed by the glass (69). The bottom surface of the horizontal part (56) is in contact with the glass (69). A horizontal part (56) is level with the top of the case (59). A PD chip will be fitted on the horizontal part (56) for making a photodiode device. Since the cathode pin (52) is separated electrically from the case, this structure enables the PD to eliminate the submount. The purpose of employing the L-shaped cathode pin is only to insulate the cathode pin from the case and to save the cost of submount. The package shown by FIG. 13 and FIG. 14 does not aim at reducing the capacitance. Since the horizontal part (56) exists at the same height as the surface of the case (53), the case•cathode capacitance Ck is big. The insulating glass (51) with a high dielectric constant increases the case•cathode capacitance Ck much more, because the glass is in contact to the bottom of the horizontal part (56). When the TO18 type package of FIG. 13 and FIG. 14 has the same dimensions as the TO18 of FIG. 2 which has a 0.21 mm thickness, a 4.2 φ disc part and a 5.4 φ flange, the package has the capacitances of case•anode Ca=0.42 pF to 0.47 pF, and case•cathode Ck=0.55 pF to 0.60 pF.

This example has no submount by transforming the cathode pin into the L-shaped pin. The decrease of capacitance brought about by eliminating the submount is 0.27 pF. However, the case•cathode capacitance is raised by about 0.2 pF due to the contact of the horizontal part to the glass having a high ε. The increase of capacitance produced by the contact cancels the decrease of capacitance resulting from eliminating the submount. The total of capacitances is about 1 pF to 1.1 pF in the package of FIG. 13 and FIG. 14. It is still too large to accomplish the purpose at which this invention aims.

DETAILED DESCRIPTION OF THE PREFERRED EMBODIMENTS

Figure 11A:
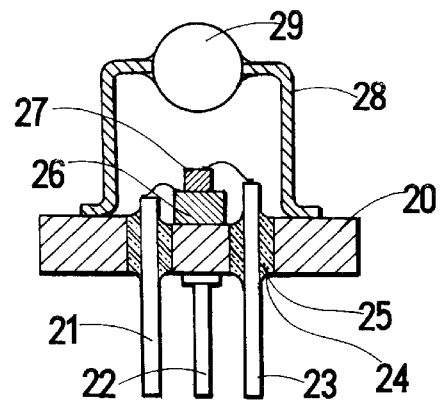
FIG. 11(a) is a sectional view of a prior photodiode device which has a PD chip, a cap and a thick metal eyelet diverted from the package of a CD laser.
Figure 11B:
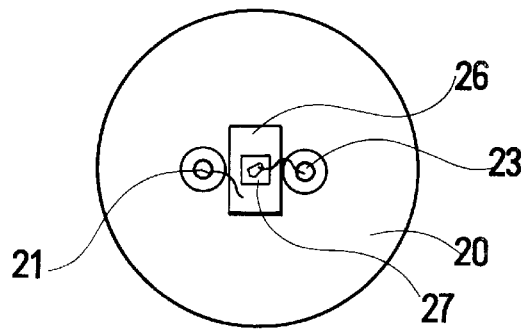
FIG. 11(b) is a plan view of the same photodiode as shown in FIG. 11(a) without the cap.
Figure 12A:
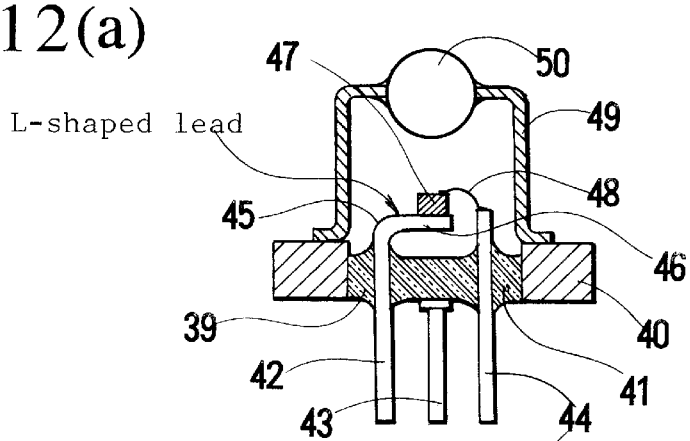
FIG. 12(a) is a sectional view of a photodiode device as an embodiment of the present invention.
Figure 12B:
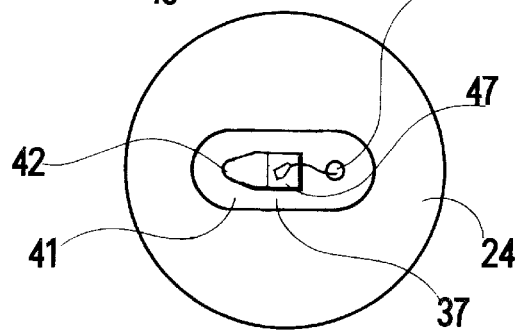
FIG. 12(b) is a plan view of the same photodiode of the embodiment without the cap.
Figure 13:
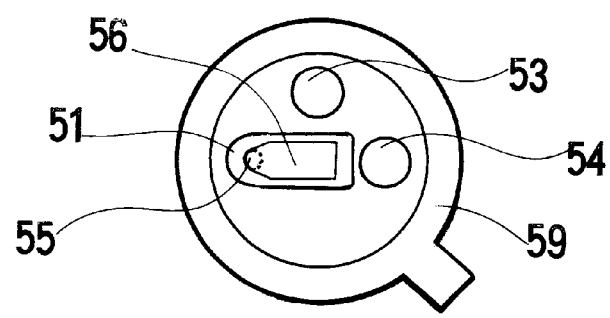
FIG. 13 is a plan view of a prior case for a photodiode having an L-shaped pin which has a horizontal part.
Figure 14:
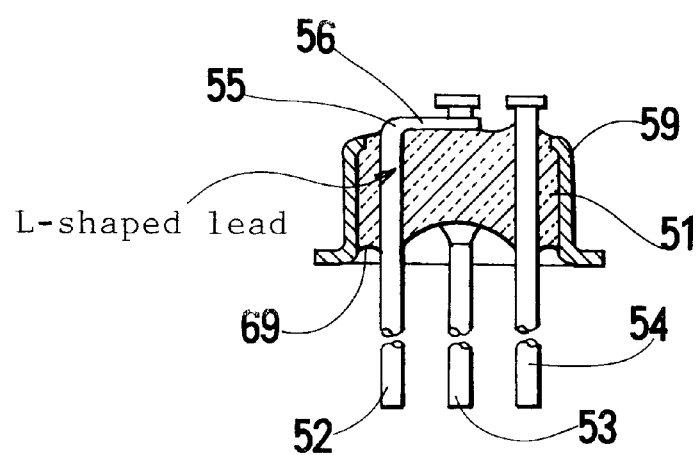
FIG. 14 is a sectional view of the same case as shown in FIG. 13.

The photodiode of the present invention shown in FIG. 12 has capacitances Ck=0.26 pF, Ca=0.24 pF and Cs=0 for the package having the same dimensions as the known package shown in FIG. 11. The sum is only 0.5 pF in the embodiment. It is about a half of the PD of FIG. 13 and FIG. 14 of the same dimensions. Of course, the capacitances depend upon the dimensions of an eyelet and pins and the materials of glass.

The embodiment has an eyelet (case) made from "KOVAR". KOVAR is a Fe-Ni-Co alloy containing 29% of Ni (nickel), 17% of Co (cobalt) and the rest of Fe (iron). The eyelet has a diameter of 5.6 mm and a thickness of 1.2 mm. The distance between neighboring pins is 2.0 mm. Each pin has a diameter of 0.30 mm.

The seal glass is KOVAR glass, for example, BHB glass of Nihondenkigarasu corporation. The dielectric constant of the BHB glass is $\epsilon$=6.0 to 6.5. The thickness of the glass is 1.0 mm. The pin hole is an elongate hole of a 3.5 mm length and a 1.5 mm width. The curvature radii are 0.75 mm at both ends. The horizontal part of the cathode pin has a width of 0.35 mm. The projection height of the horizontal part is 0.35 mm from the eyelet surface.

These dimensions give the package of the embodiment the above-written capacitances (Ck=0.26 pF, Ca=0.24 pF, Cs=0). Any prior package having been explained has a capacitance of at least 1 pF. The package of the present invention has a capacitance of less than half of the prior packages. The semiconductor devices of the present invention succeed in enhancing the frequency range by reducing the capacitances. The application of the present invention to photodiode modules will now be explained.

[APPLICATION TO A PD MODULE]

Figure 1A:
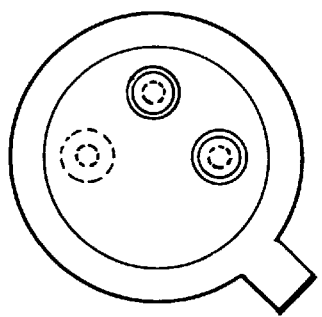
FIG. 1(a) is a plan view of a prior TO46 type package which is usually employed for mounting a photodiode chip.
Figure 1B:
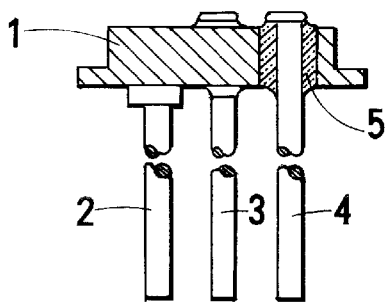
FIG. 1(b) is a sectional view of the same TO46 package as shown in FIG. 1(a).
Figure 2A:
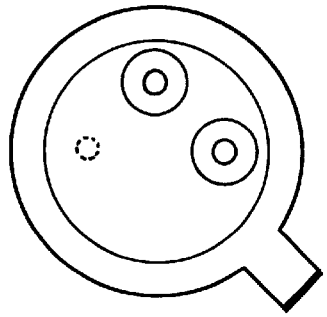
FIG. 2(a) is a plan view of a prior TO18 type package which is conventionally used for mounting a photodiode chip.
Figure 2B:
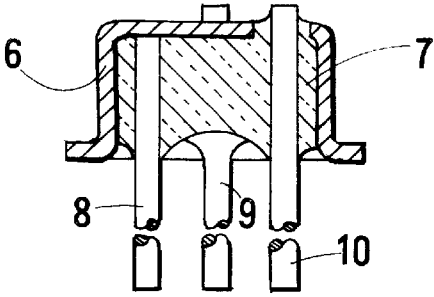
FIG. 2(b) is a sectional view of the same TO46 package as shown in FIG. 2(a).
Figure 3:
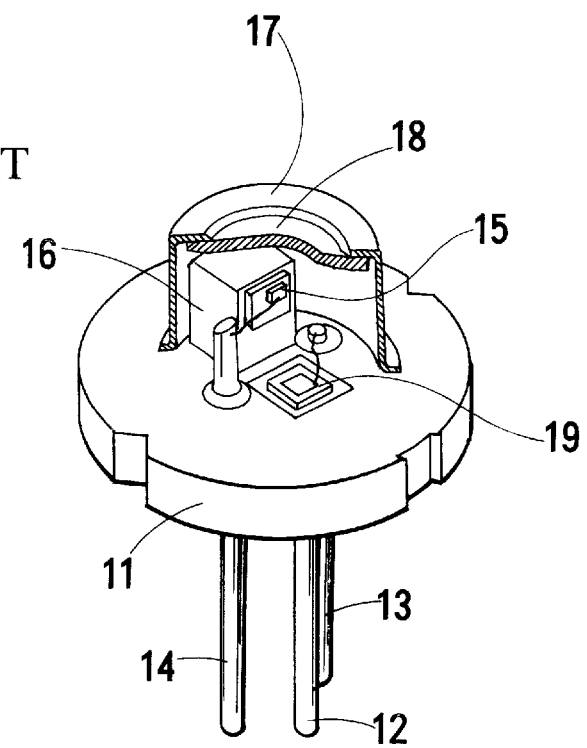
FIG. 3 is a perspective view of a prior CD package including a CD laser.
Figure 4:
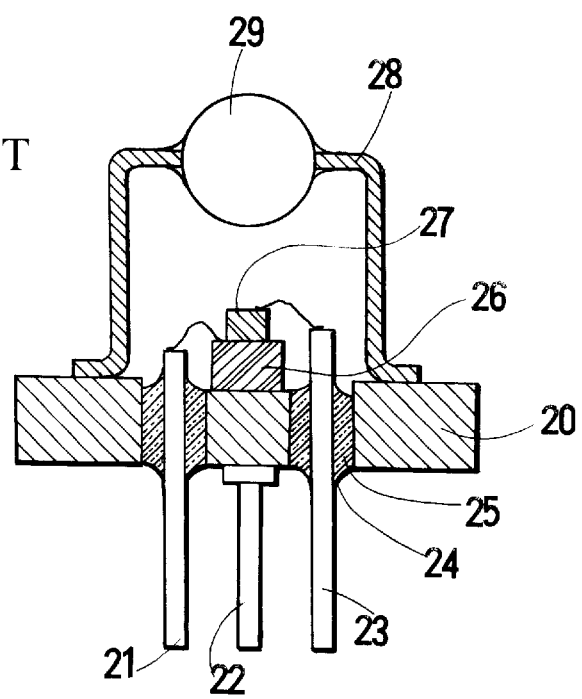
FIG. 4 is a sectional view of a photodiode which has a PD chip and a thick case which is diverted from the prior CD laser package.
Figure 5:
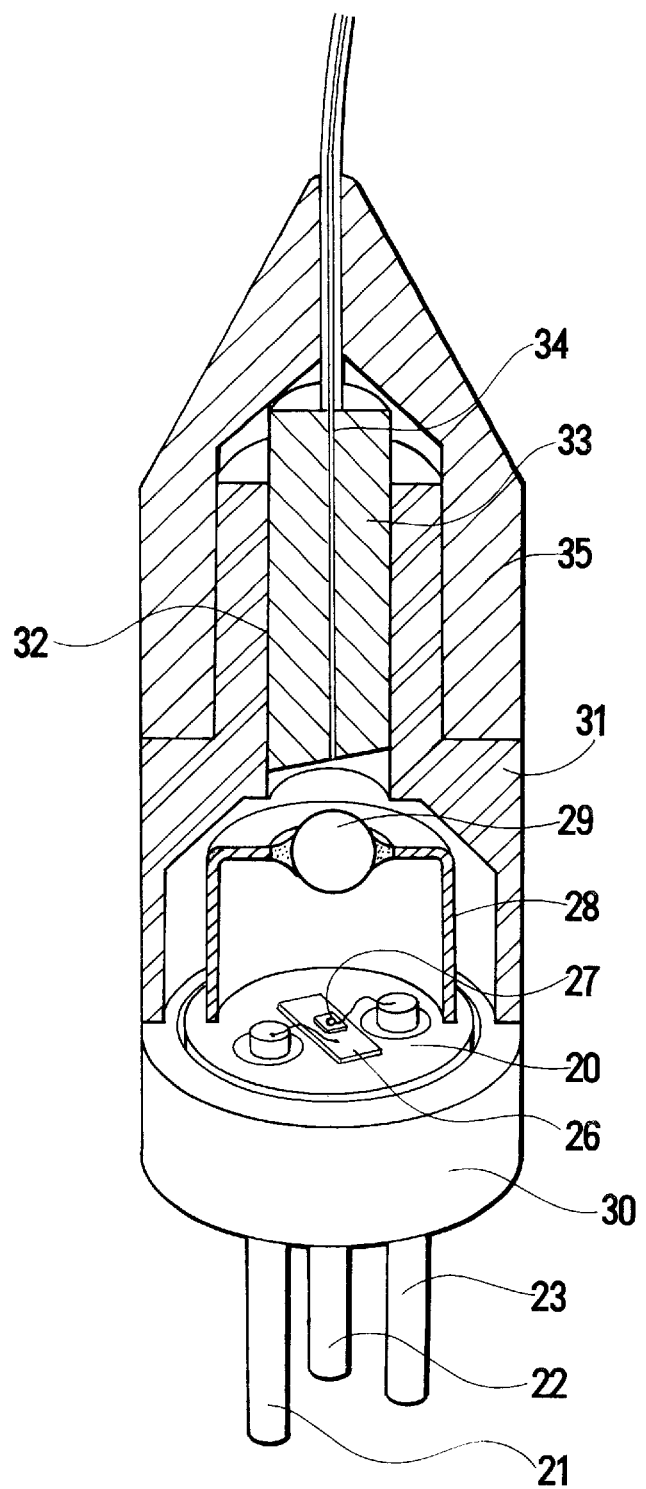
FIG. 5 is a partially-sectioned perspective view of a prior example of a photodiode module.

The low-capacitance package of this invention is useful for a photodiode module which has a sensitivity in the wavelength range between 1.3 $\mu$m and 1.55 $\mu$m, useful for Fiber-Optic-CATV. The photodiode chip has an InGaAs layer as a light receiving layer. This PD module is similar to the prior PD module of FIG. 5 except for the package structure. Lacking a submount, the package holds a PD chip upon the horizontal part of the L-shaped cathode pin. A photodiode having a light receiving layer of InGaAs is superior in sensitivity to near-infrared light. The InGaAs photodiodes respond to input infrared light at a high speed without the distortion of signals by reverse-biasing the PD at a voltage of 5V to 15V. The high speed response is further enhanced by assembling the PD chip with the low-capacitance package of the present invention.

Figure 15:
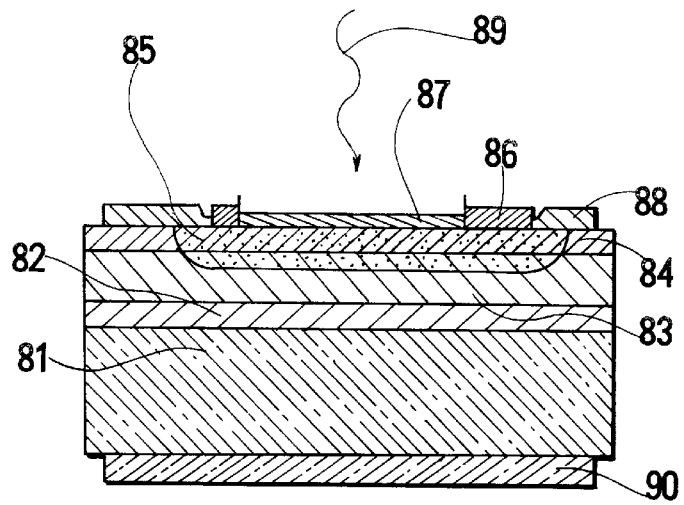
FIG. 15 is a sectional view of a prior photodiode chip having an InGaAs light receiving layer.

FIG. 15 is a sectional view of the InGaAs photodiode chip which is installed on the package. The PD chips are produced on an n-InP wafer (81) as a starting material. An n-InP buffer layer (82), an n-InGaAs light receiving (absorption) layer (83) and an n-InP window layer (84) are epitaxially deposited on the n-InP wafer (81) by an epitaxial growth method. The wafer having the layer structure n-InP (window)/n-InGaAs(absorption)/n-InP(buffer)/n-InP (substrate) is called an epitaxial wafer. PD chips are produced on the epitaxial wafer by the processes of covering the peripheries of the parts which will be individual chips with a mask, diffusing zinc (Zn) atoms from the upper openings of the mask into the n-InGaAs layer (83), making p-regions (85) reaching the midway of the InGaAs receiving layer (83), producing annular p-electrodes (86) on the p-regions (85), and covering the peripheries outside the p-electrodes with passivation films (88) for protecting the ends of the pn-junctions.

An n-electrode (90) is formed overall on the bottom of the n-InP substrate (81). The top annular p-electrode (86) is an anode and the bottom overall n-electrode (90) is a cathode. In a detection device, the n-electrode (90) will be positively biased and the p-electrode (86) will be negatively biased. The pn-junction is reversely-biased. Light beams (89) impinge on the PD chip through an opening enclosed by the annular p-electrode (86). The opening is covered with an antireflection film (87). The light beams generate pairs of electrons and holes in the vicinity of the pn-junction. The electrons and the holes are pulled to the electrodes (90) and (86) by the reverse-bias. The flow of electrons and holes is called a photocurrent. The photocurrent will be converted to a voltage by the following circuits of, for example, FIG. 6 to FIG. 8.

Figure 16:
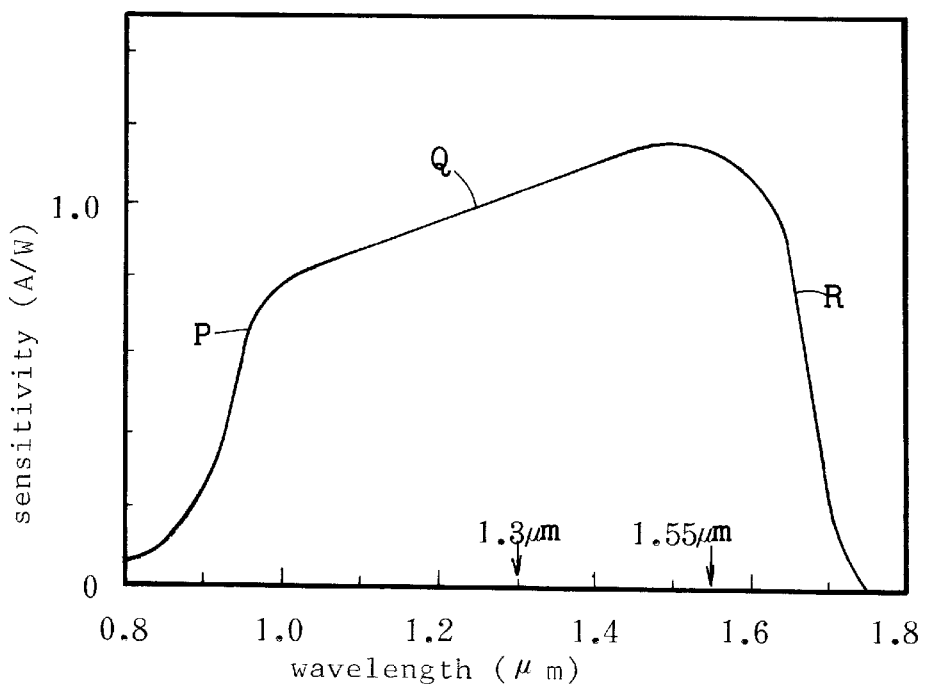
FIG. 16 is a graph showing the sensitivity dependence on wavelength of the photodiode shown in FIG. 15.

FIG. 16 shows the relation between the wavelength ($\mu$m) and the sensitivity (A/W) of the PD of FIG. 15. The abscissa denotes the wavelength $\lambda$ of the incident light. The ordinate is the sensitivity (A/W). The sensitivity curve begins to rise at point P ($\lambda$=0.95 $\mu$m), and begins to fall at point R ($\lambda$=1.64 $\mu$m). The photodiode has a wide sensitivity range (Q) from 1.0 $\mu$m to 1.6 $\mu$m. In a photodiode, a pn-junction yields an electrostatic capacitance. The diameter of the light receiving region determines the width of the pn-junction. The wider the light receiving region is, the greater the sensitivity rises. But a wide pn-junction incurs a large capacitance and a delay of response of the photodiode. High speed response can be realized by a small light receiving region and a narrow pn-junction. In addition, the electrostatic capacitance depends also upon the reverse-bias through the thickness of a depletion layer which is in proportion to a square root of the reverse-bias.

Fiber-Optic-CATV systems, in general, adopt photodiodes having a small light receiving region of a diameter of 80 $\mu$m to 100 $\mu$m for obtaining a high speed response. For example, a photodiode having a 80 $\mu$m $\phi$ light receiving region shows 0.34 pF of an electrostatic capacitance (pn-junction capacitance) at a reverse-bias of 15V. The capacitance of the chip itself is very small. The package of the present invention is suitable, in particular, for such a photodiode chip having an inherent small capacitance so as to realize a very high speed response.

Figure 17:
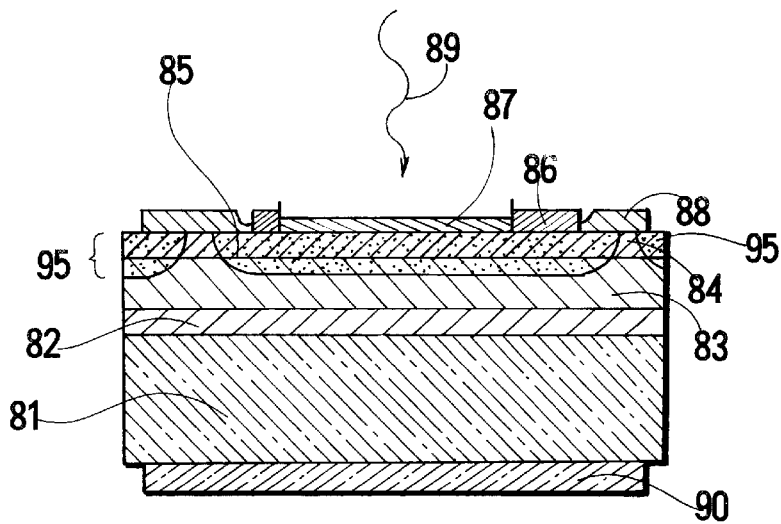
FIG. 17 is a sectional view of an improved photodiode chip having an extra p-region diffused with zinc atoms at the periphery for suppressing the delay of the response, which has been disclosed by Japanese Patent Laying Open No. 4-111477 submitted by the same applicant.

FIG. 17 shows an improved photodiode chip having a basic configuration similar to that of the conventional photodiode shown in FIG. 15. The improved PD of FIG. 17 has another Zn-diffusion region (95) at its periphery. The outer p-region (95) and the central p-region (85) are produced by diffusing Zn atoms at the same time. There are two pn-junctions. The peripheral pn-junction is effective in shortening the response time further. If stray light enters the periphery of the chip, extra pairs of electrons and holes would be produced in the periphery and an extra current would be induced by the electrons and holes. But because of the weaker bias, the speeds of the holes and electrons born in the periphery are lower than the speeds of the holes and electrons generated in the central part. Thus the extra current would induce a delay of response. In the improved photodiode of FIG. 17, the peripheral Zn-diffusion region (95) prevents the electrons and holes produced by the stray light from going their ways to the electrodes by the double pn-junction barriers. The extra carriers extinguish halfway by recombination. The photodiode of FIG. 17 was disclosed by Japanese Patent Application No. 2230206(2-30206/'90)

(Japanese Patent Laying Open No. 4-111477(111477/'92)) of the same applicant of the present invention, which is incorporated herein by reference.

A PD device was produced by mounting the PD chip of FIG. 17 in a package of an 80 μm diameter as shown in FIG. 12. The PD device was assembled into the detection circuit of FIG. 8. The winding ratio of the transformer is N:1=2:1. The impedance of the amplifier is 75 Ω. Thus the impedance of the PD is 300 Ω(75×2²). The transformer can match the impedance of the PD to the impedance of the amplifier at the expense of the amplitude.

Figure 18:
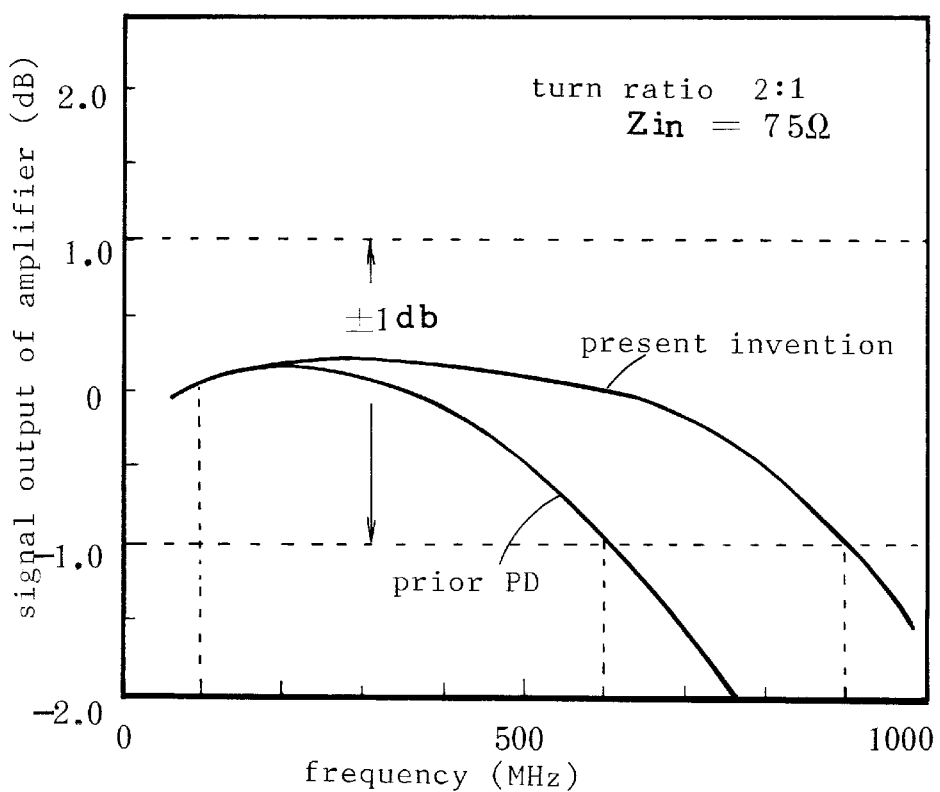
FIG. 18 is a graph of the response performance of the prior PD module shown by FIG. 4 and the embodiment PD module denoted by FIG. 12 which are assembled in the transformer load circuit of FIG. 8.

The response performance of the photodiode device was measured under the condition of the reverse-bias of 15V. FIG. 18 shows the response of the embodiment PD. The abscissa is the frequency of signals (MHz). The ordinate is the output of the amplifier (AMP). The output is normalized by dividing output power by the power at 100MHz. The practical frequency range is defined as a region which gives an output power within ±1 dB from the standard (0 dB). The maximum frequency which gives the output power of −1 dB is 900 MHz in the embodiment. For the purpose of comparison, a similar circuit of FIG. 8 having a conventional photodiode device of FIG. 11 was made as a comparison example. The response of the comparison example measured under the same condition is shown in FIG. 18. The maximum frequency of the practical use is only 600 MHz. Thus this invention succeeds in enhancing the effective frequency range from 600 MHz to 900 MHz. The improvement of response results from the reduction of the capacitances between the case and the pins.

The photodiode module of the present invention was used in an FiberOptic-CATV system having 100 channels to determine the effectiveness of the PD device of the present invention as an analog PD device. The performance as a PD module is estimated by second order distortion, sensitivity and so on. The performance of the PD module of the present invention to 100 channels is nearly equal to the performance of the known PD module of FIG. 5 to 40 channels. This invention can increase the number of channels from 40 to 100 due to the enhancement of the response speed. The above examples exhibit the improvement of PD modules as analog PD devices favorable for the circuit of FIG. 8.

[APPLICATION TO DIGITAL SIGNAL TRANSMISSION]

Figure 6:
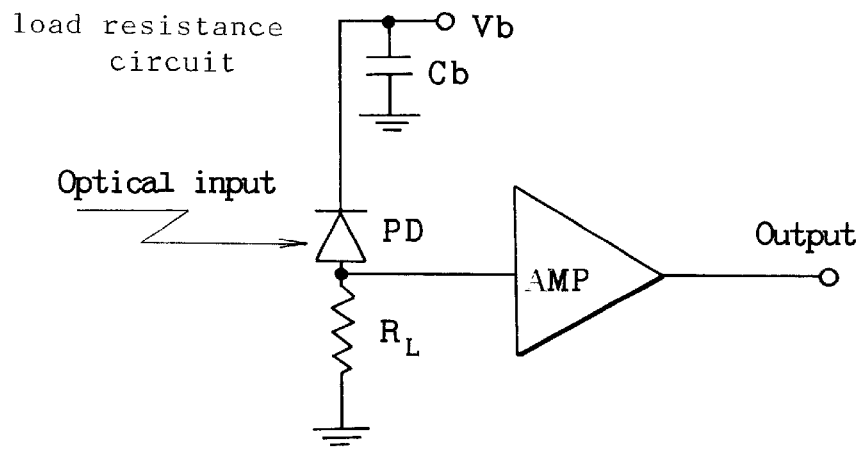
FIG. 6 is a resistor load type circuit for amplifying signals of a photodiode which is suitable for treating digital signals.
Figure 7:
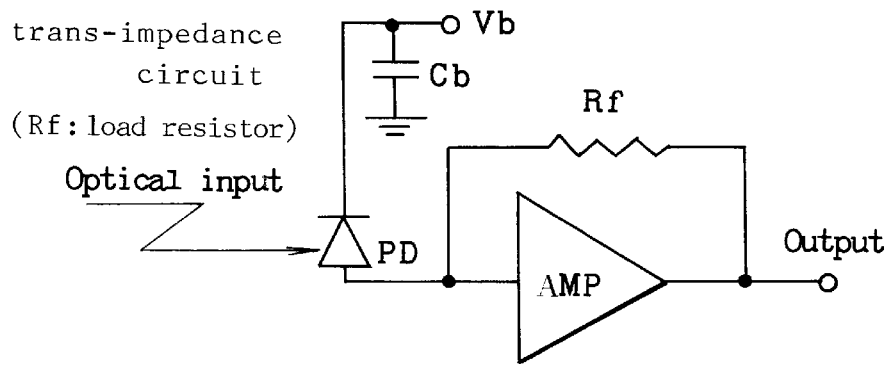
FIG. 7 is a trans-impedance type circuit for amplifying signals of a photodiode which is favorable for handling digital signals.
Figure 8:
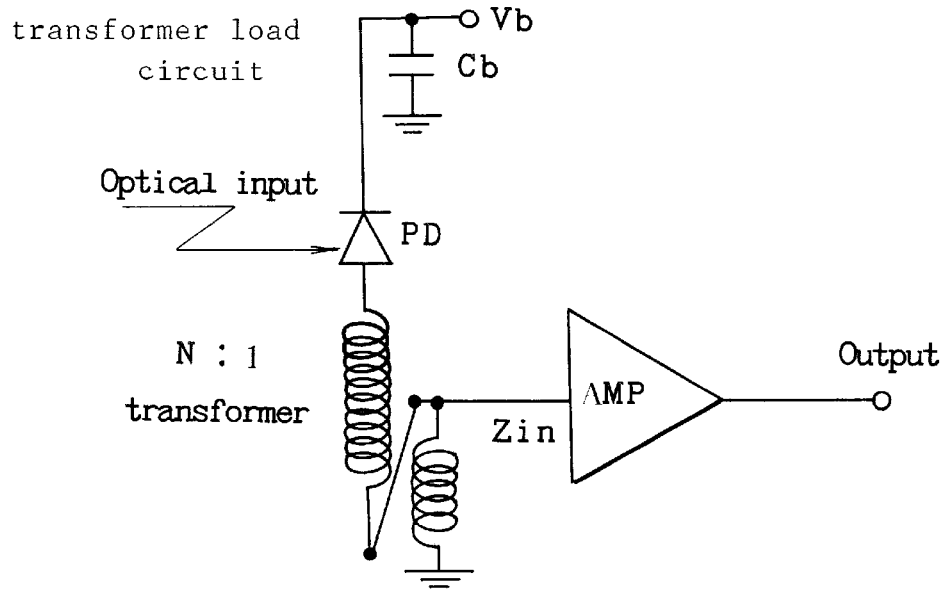
FIG. 8 is a transformer load type circuit for amplifying signals of a photodiode which is preferable for analog signals.
Figure 9:
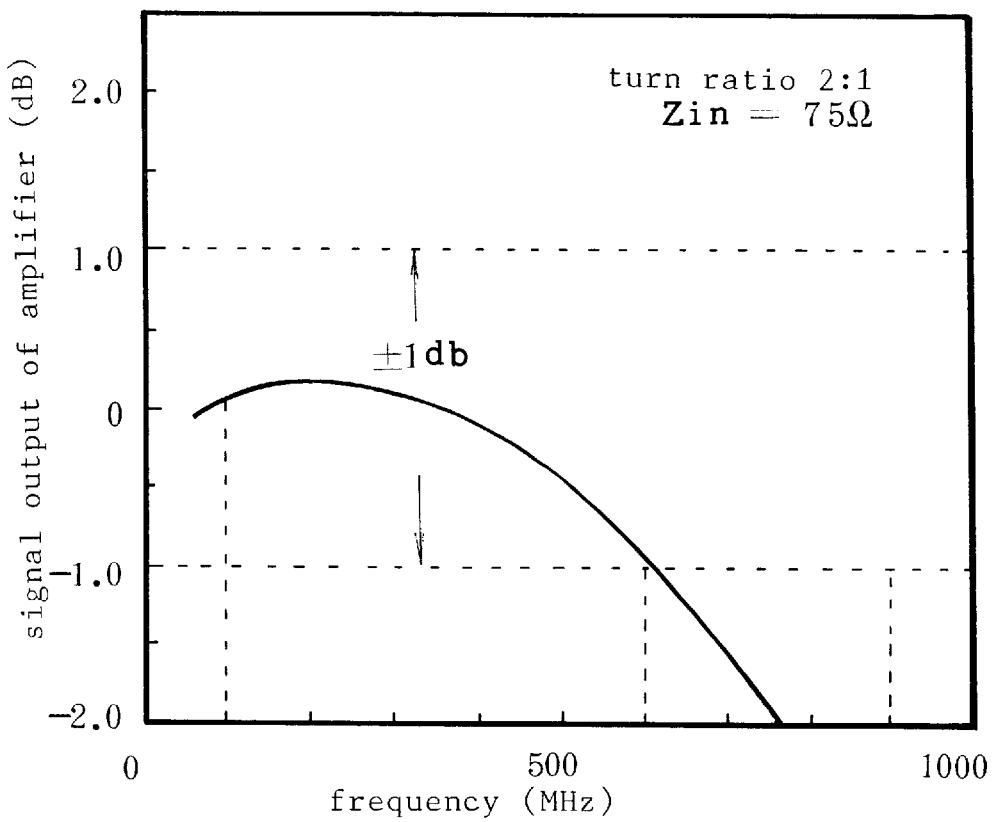
FIG. 9 is a graph of signal output power as a function of signal frequency showing the response performance of a prior photodiode connected to the transformer load type circuit of FIG. 8.
Figure 10:
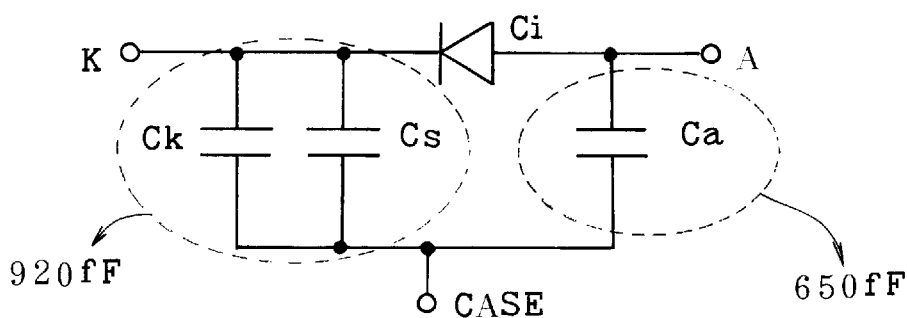
FIG. 10 is an equivalent circuit of a PD module including a cathode•case capacitance Ck, a submount capacitance Cs and an anode• case capacitance Ca.

In addition to the analog devices, the invention can be applied to digital PD devices preferable for the circuits of FIG. 7 and FIG. 6. The PD devices of the present invention are useful as receiving modules of high speed digital optical networks of several gigabits/second to tens of gigabits/second.

[APPLICATION TO A PACKAGE OF LASER DIODE]

The present invention is effective in enhancing the response performance of a photodiode by providing a low-capacitance package. The scope of application, however, is not restricted to packages of photodetecting devices. This invention is also advantageous for a package of a laser diode. Since the capacitance is small, the package can contribute to producing a laser having a high speed response. Such a laser will be suitable for the light source of an analog signal transmission system, for example, Fiber-Optic-CATVs or digital signal transmission of optical network systems. This invention, however, cannot apply to ordinary laser diodes which launch light beams from side ends in the horizontal direction parallel with the chip surface. The ordinary laser is called an "end-emitting laser".

A laser which emits light in the direction normal to the surface has recently been proposed. The laser is called a "surface emitting laser". Surface-emitting lasers have not yet become practical, because the in output power is still too small. If such a surface-emitting laser is produced some day, this invention will provide a good package for it. The laser diode will be mounted on the horizontal part of the L-shaped pin.

The surface-emitting laser has a substrate, a multilayer of a plurality of semiconductors deposited on the substrate, a bottom electrode on the substrate, and an annular top electrode formed on the multilayer. Injection of a current through the electrodes makes light in the semiconductor multilayer. The light progressing in the vertical direction, induces further emission in the medium. The bottom electrode and the multilayer form a resonator by reflecting the light in the vertical direction reciprocally. In the reciprocal propagation, light amplifies itself by absorbing the electric power supplied by the injection current. The laser launches a part of the light in the normal direction through the top annular electrode like an LED. The resonator, however, is now still too short to accomplish sufficient gain for laser oscillation. Thus no surface-emitting laser has succeeded in laser oscillation yet. Current researches on surface-emitting lasers are reviewed, e.g., by Kenichi Iga, "SURFACE EMITTING LASERS", OPTOELECTRONICS-Device and Technologies, vol.9, No.2, p167–176(1994).

The surface-emitting laser has a wide electrode on the bottom and an annular electrode on the top. The laser can be mounted on the low-capacitance package of the present invention by joining the bottom of the laser to the horizontal part of the L-bent pin. The structure alleviates the capacitance between the chip and the case. However, the pn-junction is not a capacitor in a laser, since the pn-junction is not reversely biased. The current flows forward across the pn-junction in the laser. Thus the input resistance is very low. The time constant CR is inherently low because of the low resistance. Although the chip—case capacitance is small, the pin case capacitance is still large in the ordinary packages. The adoption of the package of the present invention will enhance the maximum of the modulation frequency of the surface-emitting laser.

The present invention proposes a package with a low electrostatic capacitance. The low-capacitance package gives a photodiode a high speed response and gives a laser a high speed modulation without raising cost and loosing mass productivity.

What we claim is:

1. A package comprising:
    a metal eyelet having a top surface, a bottom surface and an elongate hole through which a plurality of pins are fixed;
    an L-shaped lead pin having a foot part, a bending part and a horizontal part, the foot part piercing the hole and being kept in the hole by an insulating material, the horizontal part holding an optoelectronic device directly upon the horizontal part and being separated from both the top surface of the eyelet and the insulating material in the hole so as not to be in contact with the insulating material; and
    at least one other lead pin fixed in the hole by the insulating material together with the L-shaped lead pin.

2. A package as claimed in claim 1, further comprising another lead pin directly fitted on the bottom surface of the eyelet.

3. A package as claimed in claim 2, wherein there is a space between the horizontal part of the L-shaped lead pin and the eyelet, and there is only the insulating material beneath the horizontal part.

4. A package as claimed in claim 3, wherein the eyelet is made from Kovar and the insulating material is Kovar glass.

5. A package as claimed in claim 4, wherein the eyelet has a diameter of about 5.6 mm and a thickness of about 1.2 mm, the insulating material has a thickness of about 1 mm, the hole has a length of about 3.5 mm and round ends of about a 0.75 mm radius, and the lead pins are distanced by about 2.0 mm from each other.

6. An optoelectronic device comprising:
   a metal eyelet having a top surface, a bottom surface and an elongate hole through which a plurality of pins are fixed;
   an L-shaped lead pin having a foot part, a bending part and a horizontal part, the foot part piercing the hole and being kept in the hole by an insulating material;
   at least one other lead pin fixed in the hole by the insulating material together with the L-shaped lead pin; and
   an optoelectronic device chip directly fixed on the horizontal part of the L-shaped lead pin.

7. An optoelectronic device claimed in claim 6, further comprising another lead pin directly fitted on the bottom surface of the eyelet.

8. An optoelectronic device as claimed in claim 7, wherein there is a space between the horizontal part of the L-shaped lead pin and the eyelet, and there is only the insulating material beneath the horizontal part.

9. A optoelectronic device as claimed in claim 8, wherein the eyelet is made from Kovar and the insulating material is Kovar glass.

10. An optoelectronic device as claimed in claim 9, wherein the eyelet has a diameter of about 5.6 mm and a thickness of about 1.2 mm, the insulating material has a thickness of about 1 mm, the hole has a length of about 3.5 mm and round ends of about a 0.75 mm radius, and the lead pins are distanced by about 2.0 mm from each other.

11. An optoelectronic device as claimed in claim 6, wherein the optoelectronic device fitted on the horizontal part is a photodetecting device chip or a light emitting device chip.

12. An optoelectronic device as claimed in claim 6, wherein the optoelectronic device is a photodiode chip having an InGaAs light receiving layer.

13. An optoelectronic device as claimed in claim 6, wherein the optoelectronic device includes an end of an optical fiber for supplying light into the optoelectronic device chip and a cap with a lens, and the end of the optical fiber is adjusted to the lens and the chip for converging the light emitted from the fiber to the chip.

14. An optoelectronic device as claimed in claim 13, wherein the chip has an InP substrate, an InP buffer layer, an InGaAs light receiving layer and an InP window layer.

15. An optoelectronic device as claimed in claim 14, wherein the chip has an n-electrode on the substrate as a cathode, a p-region formed in the center part spreading from the window layer to the light receiving layer by diffusing p-type impurity, and an annular p-electrode formed on the central p-region as an anode, the n-electrode is directly bonded on the horizontal part of the cathode pin, and the p-electrode is connected to the anode pin by a wire.

16. An optoelectronic device as claimed in claim 15, wherein the chip has an extra p-region at its periphery made by diffusing zinc for preventing extra electrons and holes yielded at the periphery from reaching the electrodes.

17. An optoelectronic device as claimed in claim 16, wherein the optoelectronic device comprises an amplifier with an input and an output and a transformer having a primary coil and a secondary coil, the cathode is connected to a power source, the anode is connected to the primary coil of the transformer, and the voltage appearing at the secondary coil is amplified by the amplifier.

18. An optoelectronic device as claimed in claim 16, wherein the optoelectronic device comprises an amplifier having an input and an output and a resistor, the cathode is connected to a power source, the anode is connected to the input of the amplifier, and the output of the amplifier is connected via the resistor to the input of the amplifier.

19. An optoelectronic device as claimed in claim 16, wherein the optoelectronic device comprises an amplifier having an input and an output and a resistor, the cathode is connected to a power source, the anode is connected to the input of the amplifier, and the resistor connects the input of the amplifier to the ground.

20. An optoelectronic device as claimed in claim 17, wherein the transformer has a coil of turn ratio of 2:1, and the optoelectronic device has a frequency range up to 1000 MHz which gives an output power within ±1 dB from the standard output.

* * * * *